United States Patent
Kim et al.

(10) Patent No.: US 11,683,892 B2
(45) Date of Patent: Jun. 20, 2023

(54) DISPLAY DEVICE AND METHOD OF MANUFACTURING THE SAME

(71) Applicant: Samsung Display Co., LTD., Yongin-si (KR)

(72) Inventors: Sunho Kim, Seongnam-si (KR); Hyun Kim, Seoul (KR); Juchan Park, Seoul (KR); Sun Hee Lee, Hwaseong-si (KR); Seonbeom Ji, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 225 days.

(21) Appl. No.: 16/903,722

(22) Filed: Jun. 17, 2020

(65) Prior Publication Data

US 2020/0404797 A1 Dec. 24, 2020

(30) Foreign Application Priority Data

Jun. 18, 2019 (KR) .................. 10-2019-0072449

(51) Int. Cl.
*H05K 5/00* (2006.01)
*H01L 51/52* (2006.01)
(Continued)

(52) U.S. Cl.
CPC ....... *H05K 5/0017* (2013.01); *H01L 51/5237* (2013.01); *H05K 5/0217* (2013.01); *H01L 51/0097* (2013.01)

(58) Field of Classification Search
CPC . H01L 51/0097; H01L 27/3244; H01L 27/32; H01L 51/56; H01L 51/5237;
(Continued)

(56) References Cited

U.S. PATENT DOCUMENTS

2008/0055831 A1* 3/2008 Satoh .................. G09F 9/30
361/600
2014/0042406 A1 2/2014 Degner et al.
(Continued)

FOREIGN PATENT DOCUMENTS

KR 10-1212172 12/2012
KR 10-2016-0002662 1/2016
(Continued)

OTHER PUBLICATIONS

Extended European Search Report dated Oct. 15, 2020, issued in European Patent Application No. 20180176.8.

*Primary Examiner* — Anthony Q Edwards
*Assistant Examiner* — Hung Q Dang
(74) *Attorney, Agent, or Firm* — H.C. Park & Associates, PLC

(57) ABSTRACT

A display device, includes: a substrate including a display front portion, a display curved portion, a non-display curved portion, and a non-display rear portion; a display layer attached to the display front portion and the display curved portion; a member attached to an inner side of the substrate, and including articulations attached to an inner side of the non-display curved portion; and a window attached to an outer side of the display layer; wherein: the display layer is attached to an outer side of the substrate; at least a portion of the display curved portion forms a first generally curved surface; at least a portion of the non-display curved portion forms a second generally curved surface; the non-display rear portion forms a substantially flat surface; at least one of the articulations has a cross-sectional width that decreases in a direction away from the substrate; and at least one of the articulations contacts each other to form the second generally curved surface of the non-display curved portion.

19 Claims, 17 Drawing Sheets

(51) Int. Cl.
*H05K 5/02* (2006.01)
*H01L 51/00* (2006.01)

(58) Field of Classification Search
CPC ........... G02F 1/13332; G02F 1/133308; G02F 1/133305; G06F 1/1637; G06F 1/1652; G09F 9/301; G09F 9/33; H05K 5/0017; H05K 5/0217
See application file for complete search history.

(56) References Cited

U.S. PATENT DOCUMENTS

| | | | |
|---|---|---|---|
| 2014/0126228 A1 | 5/2014 | Lee et al. | |
| 2014/0132481 A1 | 5/2014 | Bell et al. | |
| 2014/0183473 A1* | 7/2014 | Lee | H01L 51/0097 257/40 |
| 2014/0340855 A1 | 11/2014 | Lee et al. | |
| 2017/0064845 A1 | 3/2017 | Jung et al. | |
| 2017/0117501 A1 | 4/2017 | Choi et al. | |
| 2018/0081399 A1 | 3/2018 | Kwon et al. | |
| 2018/0246544 A1 | 8/2018 | Kwon et al. | |
| 2018/0359454 A1 | 12/2018 | Jeong | |
| 2019/0061318 A1 | 2/2019 | Jung et al. | |
| 2019/0343010 A1 | 11/2019 | Ji et al. | |

FOREIGN PATENT DOCUMENTS

| | | |
|---|---|---|
| KR | 10-2017-0049713 | 5/2017 |
| KR | 10-2018-0032742 | 4/2018 |
| KR | 10-1897541 | 9/2018 |
| KR | 10-2019-0126962 | 11/2019 |

* cited by examiner

DISPLAY DEVICE AND METHOD OF MANUFACTURING THE SAME

CROSS-REFERENCE TO RELATED APPLICATION

This application claims priority from and the benefit of Korean Patent Application No. 10-2019-0072449, filed on Jun. 18, 2019, which is hereby incorporated by reference for all purposes as if fully set forth herein.

BACKGROUND

Field

Exemplary implementations of the invention relate generally to a display device and a method of manufacturing the same and, more particularly, to display devices having a curved shape and methods of manufacturing the same.

Discussion of the Background

Recently, a display device having curved edges, that is, a bended display device is has been widely used. Since the bended display device has bent edges, the display area may be disposed on a front portion (hereinafter, referred to as a display front portion) and a portion of a curved portion (hereinafter, referred to as a display curved portion) and a non-display area may be disposed on another portion of the curved portion (hereinafter, referred to as a non-display curved portion) and a rear portion (hereinafter, referred to as a non-display rear portion). Accordingly, the bended display device may provide various interfaces to a user by driving the display front portion and the display curved portion separately. In addition, the non-display curved portion and the non-display rear portion on which an image is not displayed may be obscured from the user's view, so that the user may be more immersed in the information on the display screen.

In general, the curved edges of the bended display device may be implemented by attaching a support member having a bent shape to a lower end of a substrate, and then bending the non-display curved portion of the substrate according to the shape of the support member, and then attaching the non-display curved portion to the support member.

The above information disclosed in this Background section is only for understanding of the background of the inventive concepts, and, therefore, it may contain information that does not constitute prior art.

SUMMARY

Applicant realized that during manufacture of display device having curved edges, an unbalanced pressure may be applied to the curved shape of the display curved portion in the process of attaching the support member to the lower end of the substrate, and the unbalanced pressure may generate cracks in the substrate. In addition, since the non-display is curved portion must be attached to the support member while bending the non-display curved portion in accordance with the already bent support member, the non-display curved portion may not be uniformly adhered to the support member, and thus the non-display curved portion may be easily detached from the support member.

Display devices having curved edges constructed according to the principles, methods and exemplary implementations of the invention minimize or eliminate the formation of cracks on the supporting substrate. In addition, the non-display curved portion of the substrate may be uniformly adhered to a support member. According to some exemplary implementations, cracks may not be generated on the substrate because no pressure is applied to a curved surface of the display curved portion, and the non-display curved portion may be uniformly adhered to the support member, so that the non-display curved portion is not readily detached from the support member.

Additional features of the inventive concepts will be set forth in the description which follows, and in part will be apparent from the description, or may be learned by practice of the inventive concepts.

According to one aspect of the invention, a display device, includes: a substrate including a display front portion, a display curved portion, a non-display curved portion, and a non-display rear portion; a display layer attached to the display front portion and the display curved portion; a member attached to an inner side of the substrate, and including articulations attached to an inner side of the non-display curved portion; and a window attached to an outer side of the display layer; wherein: the display layer is attached to an outer side of the substrate; at least a portion of the display curved portion forms a first generally curved surface; at least a portion of the non-display curved portion forms a second generally curved surface; the non-display rear portion forms a substantially flat surface; at least one of the articulations has a cross-sectional width that decreases in a direction away from the substrate; and at least one of the articulations contacts each other to form the second generally curved surface of the non-display curved portion.

At least one of the articulations may have a generally trapezoidal cross-sectional shape.

At least one of the articulations may have a generally triangular cross-sectional shape.

The articulations may include joint units having substantially identical cross-sectional shapes.

At least one of the cross-sectional shapes of the articulations may be individually matched to positions in the second generally curved surface.

The member may include a support member including an adhesive disposed between the articulations.

At least one of the articulations may adhere to each other by the adhesive when the second generally curved surface of the non-display curved portion may be formed by the external pressure.

A printed circuit board may be disposed adjacent to the non-display rear portion of the substrate; wherein the support member may have a recess corresponding to a shape of the printed circuit board.

According to another aspect of the invention, a method of manufacturing a display device includes the steps of: preparing a substrate including a display front portion, a display curved portion including at least a portion forming a first generally curved surface, a is non-display curved portion configured to be bent by an external pressure, and a non-display rear portion having a generally flat surface; preparing a member including articulations; attaching the member to an inner side of the substrate such that the articulations are attached to an inner side of the non-display curved portion and at least one of the articulations has a cross-sectional width that decreases in a direction away from the substrate to form at least one gap therebetween; and applying the external pressure to the member to close the at least one gap such that at least one of the articulations contacts each other and at least a portion of the non-display curved portion forms a second generally curved surface.

A plate may be disposed on an outer side of the substrate when the member is attached to the inner side of the substrate.

At least one of the articulations may have a generally trapezoidal cross-sectional shape.

At least one of the articulations may have a generally triangular cross-sectional shape.

The articulations may have joint units having substantially identical cross-sectional shapes.

At least one of the cross-sectional shapes of the articulations may be individually positioned to match to the second generally curved surface.

The member may include a support member having an adhesive disposed between the articulations.

At least one of the articulations may adhere to each other by the adhesive when the second generally curved surface of the non-display curved portion is formed by external pressure.

The method wherein the member comprises a support member and may further include the steps of forming a recess in the support member corresponding to a shape of a printed circuit board; and disposing the printed circuit board in the recess adjacent to the non-display rear portion of the substrate.

The method may further include the step of attaching a display layer to an outer surface of the display front portion and an outer side of the display curved portion.

The method may further include the step of attaching a window to an outer side of the display layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
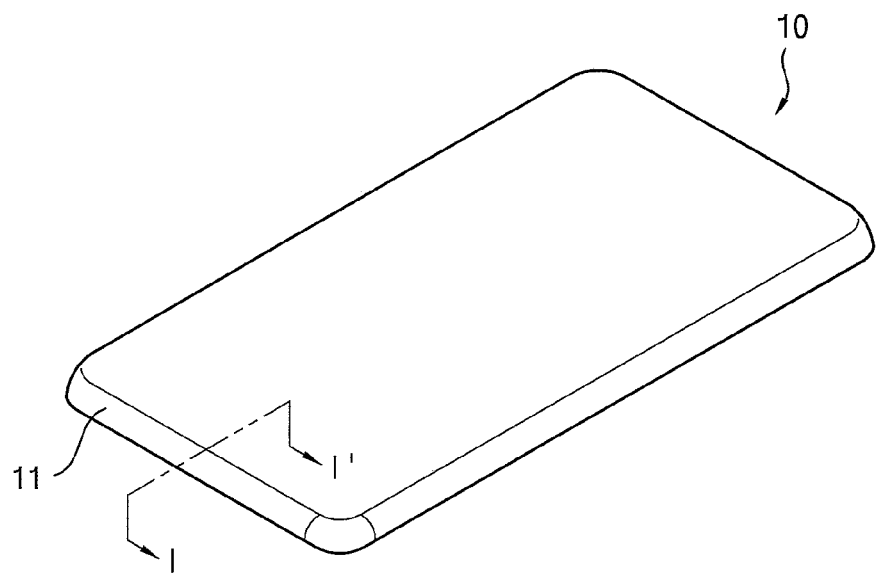
FIG. 1 is a perspective view of an exemplary embodiment of a display device constructed according to principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and is devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different is orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the is particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
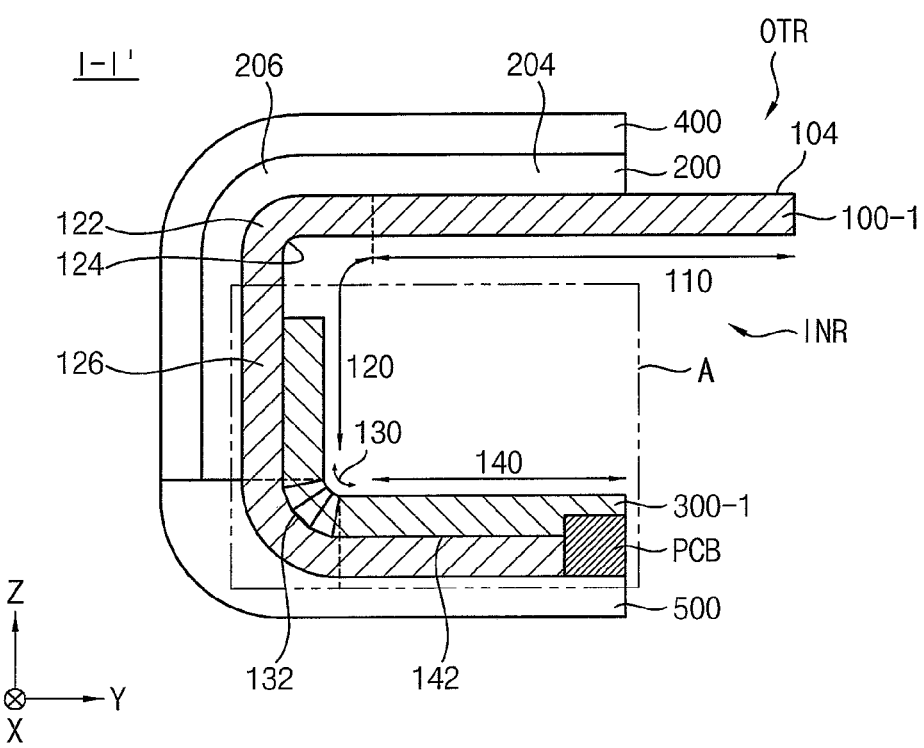
FIG. 2 is a cross-sectional view taken along line I-I' of FIG. 1.

FIG. 1 is a perspective view of an exemplary embodiment of a display device constructed according to principles of the invention. FIG. 2 is a cross-sectional view taken along line I-I' of FIG. 1.

Referring to FIG. 1 and FIG. 2, a display device 10 may include a substrate 100-1, a display layer 200, a member in the form of a support member 300-1 and a window 400. The display device 10 may include a plurality of edges 11, and each of the edges 11 may be at least partially bent. In some exemplary embodiments, as shown in FIG. 1, the display device 10 may have four edges 11, and each of the edges 11 may be bent toward a rear surface of the display device 10 from a front surface of the display device 10.

Both sides of the substrate 100-1 may be divided into an outer side OTR and an inner side INR based on the substrate 100-1. For example, on the outer side OTR of the substrate 100-1 the display layer 200 is disposed, and on the inner side INR of the substrate 100-1 the support member 300-1 is disposed. The substrate 100-1 may include a display front portion 110 is to which a portion 204 of the display layer 200 is attached to the outer surface 104 of the substrate 100-1, a display curved portion 120 to which another portion 206 of the display layer 200 is attached to the outer side OTR, a non-display curved portion 130 to which the display layer 200 is not attached, and a non-display rear portion 140 to which the display layer 200 is not attached. For example, at least a portion 122 of the display curved portion 120 may form a first generally curved surface 124, substantially the entire portion of the non-display curved portion 130 may form a second generally curved surface 132, and substantially the entire of the non-display rear portion 140 may form a generally flat surface 142. In addition, driving elements (for example, transistors, integrated circuits, etc.) for driving the display layer 200 may be further disposed on the substrate 100-1. The substrate 100-1 may include a plastic material having flexibility. For example, the substrate 100-1 may include a polyimide material.

The display front portion 110 may be disposed on the front surface of the display device 10, and a portion 204 of the display layer 200 may be attached to the outer side OTR of the display front portion 110. For example, the display front portion 110 may have a generally flat shape having a generally rectangular rounded corner, but a shape of the display front portion 110 is not limited thereto. The display front portion 110 may have various shapes.

The display curved portion 120 may extend from the display front portion 110, and at least the portion 122 of the display curved portion 120 may form the first generally curved surface 124. The first generally curved surface 124 may have a shape in which a plane is bent. For example, as shown in FIG. 2, the first generally curved surface may have a generally curved shape that gradually connects a plane formed by the display front part 110 and a plane generally perpendicular to the plane formed by the display front part 110. As such, a generally curved surface may be formed on the portion of the display curved portion 120, and a generally flat is surface may be formed on another portion 126 of the display curved portion 120. In some exemplary embodiments, substantially the entirety of the display curved portion 120 may form a generally curved surface. To bend the non-display curved portion 130, a conventional support member also needs to be attached to the first generally curved surface of the display curved portion. As a result, an unbalanced pressure may be applied to the first generally curved surface of the display curved portion, and cracks may be generated in the substrate.

The non-display curved portion 130 may extend from the display curved portion 120 and may be disposed between the display curved portion 120 and the non-display rear portion 140. Substantially the entire portion of the non-display curved portion 130 may form the second generally curved surface 132. The second generally curved surface 132 may have a shape in which a plane is bent. For example, as shown in FIG. 2, the second generally curved surface 132 may be bent toward the inner side INR of the substrate 100-1, and may have a generally curved shape that gradually connects a plane formed by the display curved portion 120 and a plane formed by the non-display rear portion 140. For example, as shown in FIG. 2, when the display curved portion 120 is bent at a right angle with respect to the display front portion 110, by bending the non-display curved portion 130 at a right angle with respect to the display curved portion 120, the non-display rear portion 140 may face the display front portion 110 and may be spaced apart from the display front portion 110. When the display curved portion 120 is bent at an acute angle (e.g., about 80 degrees) with respect to the display front portion 110, by bending the non-display curved portion 130 at an obtuse angle (e.g., about 100 degrees) with respect to the display curved portion 120, the non-display rear portion 140 may face the display front portion 110 and may be spaced apart from the display front portion 110. As such, a curvature of the second generally curved surface 132 formed on the non-display curved portion 130 may be adjusted, so that the substrate 100-1 may minimize the exposure of the non-display area (i.e., the area where the display layer 200 is not disposed) and may maximize the exposure of the display area (i.e., the area where the display layer 200 is disposed) when viewed from the front surface. The structure of the display device 10 is not limited to the above structure in which the display front portion 110 and the non-display rear portion 140 are generally parallel, and the general curvature of the second generally curved surface 132 formed on the non-display curved portion 130 may vary as desired.

In the conventional support member, both the support member and the non-display curved portion need to be attached each other in a bent state to form the second generally curved surface of the non-display curved portion. Accordingly, the non-display curved portion may not be uniformly adhered to the support member, and thus the non-display curved portion may be easily detached from the support member.

The non-display rear portion 140 may not be attached to the display layer 200, and substantially the entire portion of the non-display rear portion 140 may form a generally flat surface 142. In addition, the non-display rear portion 140 may have a generally rectangular flat shape having generally rounded corners corresponding to the shape of the display front portion 110. The non-display rear portion 140 may extend from the non-display curved portion 130 to face the display front portion 110 and may be spaced apart from the display front portion 110. In addition, one or more components such as a printed circuit board PCB (for example, a flexible printed circuit board) may be disposed (or connected) in the non-display area of the display device 10. For example, as shown in FIG. 2, the display device 10 may further include the printed circuit board PCB disposed adjacent to the non-display rear portion 140. A timing controller for controlling a data driver, a scan driver, a light emitting driver, and the like, a touch driver for sensing a user's touch, and a power supply may be mounted on the printed circuit board PCB. The power supply and the timing controller may apply a power signal and a control signal to the data driver, the scan driver, and the light emitting driver, so that the display layer 200 displays an image. The touch driver may drive a touch screen to detect the user's touch on the window 400.

The display layer 200 may be attached to the outer side OTR of the substrate 100-1, and may define the display area of the display device 10. The display layer 200 may include a plurality of pixels so that the display layer 200 displays an image. Each of the plurality of pixels may include a display element. For example, the display element may be an organic light emitting diode. In some exemplary embodiments, the display layer 200 may include an encapsulation layer. The encapsulation layer may be formed on the organic light emitting diode to protect the organic light emitting diode from penetration of moisture or oxygen. To implement the bended display device, the encapsulation layer may be formed of an inorganic layer, or may have a structure in which an inorganic layer and an organic layer are alternately stacked.

The support member 300-1 may be attached to the inner side INR of the substrate 100-1, and may support the substrate 100-1. In addition, the support member 300-1 may include articulations in the form of joint units 311 attached to the inner side INR of the non-display rear portion 140 so that the support member 300-1 bends the non-display curved portion 130 of the substrate 100-1. The support member 300-1 may include a recess in the form of a step difference 304 corresponding to a general shape of the printed circuit board PCB disposed (or connected) adjacent to the non-display rear portion 140. The structure of the support member 300-1 will be described in detail with reference to FIG. 3 to FIG. 6

The support member 300-1 may be attached to the inner side INR of the substrate is 100-1. For example, the display device 10 may further include an adhesive layer disposed between the support member 300-1 and the substrate 100-1, so that the support member 300-1 may be attached to the inner side INR of the substrate 100-1. The adhesive layer may be formed in a film form such that the adhesive layer is attached to the support member 300-1, or may be formed in a particle form such that the adhesive layer is applied on the support member 300-1. The adhesive layer may include an optically clear adhesive or a pressure sensitive adhesive.

The window 400 may be disposed on the display area of the substrate 100-1, and may protect the display layer 200 from an external impact and scratches that may be applied during use of the display device 10. Edges of the window 400 may be bent corresponding to the display curved portion 120 of the substrate 100-1 through processing (e.g., thermoforming process). The window 400 may include a glass or a plastic, but is not limited thereto. The window 400 may include any material capable of forming a portion to bend. The window 400 may be attached to the display layer 200. For example, the display device 10 may further include an adhesive layer disposed between the window 400 and the display layer 200 so that the window 400 may be attached to the display layer 200. The adhesive layer may include the optically clear adhesive and/or the pressure sensitive adhesive.

The display device 10 may further include a cover 500 and/or a functional layer. The cover 500 may be disposed under the non-display area of the substrate 100-1, and may protect the substrate 100-1 from an external impact and scratches that may be applied during use of the display device 10. The functional layer may be disposed between the display layer 200 and the window 400. The functional layer may include at least one of an optical film and a touch screen. The optical film may reflect an external light to improve a brightness of the display device 10, or may diffuse a light to make a luminance of an image displayed on the display device 10 uniformly. The touch screen may include a touch sensor including a first touch electrode and a second touch electrode which are cross-aligned to recognize a user's touch on the window 400.

Figure 3:
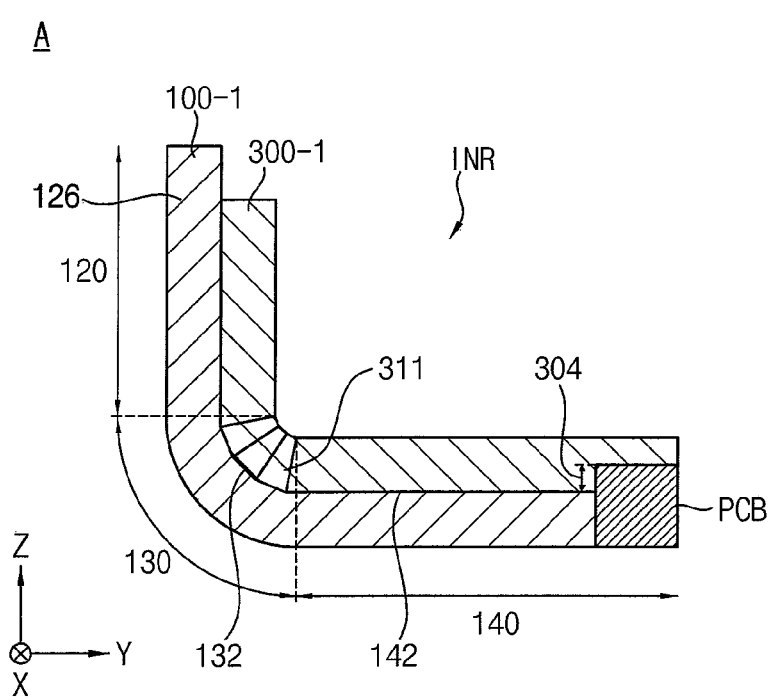
FIG. 3 is a cross-sectional enlarged view of Area A of FIG. 2.
Figure 4:
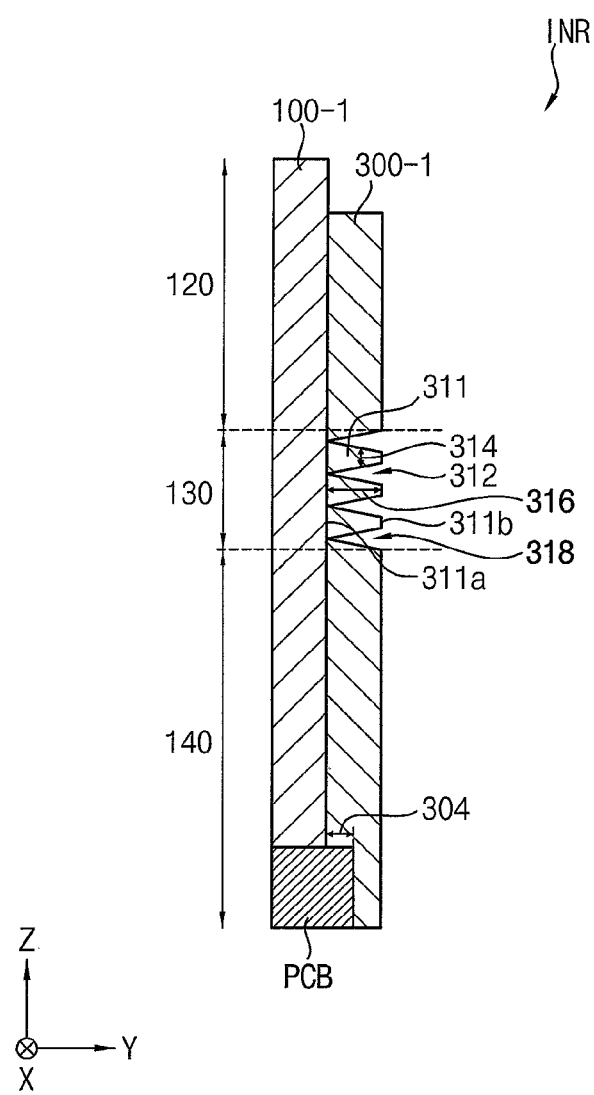
FIG. 4 is a cross-sectional view of the unbent substrate and support of FIG. 3.

FIG. 3 is a cross-sectional enlarged view of Area A of FIG. 2. FIG. 4 is a cross-sectional view of the unbent substrate and support of FIG. 3.

Referring to FIG. 3 and FIG. 4, the support member 300-1 may be attached to the inner side INR of the substrate 100-1, and may support the substrate 100-1. In addition, the support member 300-1 may include the joint units 311 attached to the non-display curved portion 130. In addition, the width 314 of each of the joint units 311 may decrease as the distance 316 from the substrate 100-1 increases in a cross-sectional view. For example, the width 314 of each of the joint units 311 may decrease toward the inner side INR of the substrate 100-1. In detail, each of the joint units 311 may include a first end 311a directly attached to the non-display curved portion 130 and a second end 311b opposing to the first end 311a. The first end 311a may be connected to each other, and the second ends 311b may be separated from each other by a gap 318 that increases in width in a direction towards end 311b. As a result, a sum of lengths of the first ends 311a may be longer than a sum of lengths of the second ends 311b.

In some exemplary embodiments, the cross-sectional shape of each of the joint units 311 may be a generally trapezoidal shape. In other exemplary embodiments, the cross-sectional shape of each of the joint units 311 may be a generally triangular shape. However, this is merely an example, and the cross-sectional shape of each of the joint units 311 is not limited thereto. In some exemplary embodiments, cross-sectional shapes of the joint units 311 are identical to each other. In other exemplary embodiments, at least two or more of the cross-sectional shapes of the joint units 311 may be different. In these exemplary embodiments, the cross-sectional shapes of the joint units 311 may be individually determined according to corresponding positions in the second generally curved surface 132. For example, the second generally curved surface 132 formed on the non-display curved portion 130 may be abruptly curved at the center of the second generally curved surface 132, and may be gently curved away from the center of the second generally curved surface 132. In some exemplary embodiments, each of the cross-sectional shapes of the joint units 311 corresponding to the position of the center which is abruptly curved may have a relatively small size and/or a generally triangular shape. On the other hand, each of the cross-sectional shapes of the joint units 311 corresponding to the position far from the center which is gently curved may have a relatively large size and/or a generally trapezoidal shape.

The joint units 311 may contact each other in various ways. In some exemplary embodiments, the joint units 311 may contact each other as an external pressure is applied to inwardly bend the support member 300-1. In other exemplary embodiments, the support member 300-1 may further include an adhesive 312 disposed between the joint units 311, and the joint units 311 may be adhered to each other by the adhesive 312.

As the external pressure is applied to the joint units 311, the joint units 311 may contact each other, and the support member 300-1 may vary from an unfolded form to a bent form. In detail, as shown in FIG. 4, when the second ends 311b are separated from each other and form the gaps 318 between the joint units 311, the support member 300-1 may have the unfolded form. As shown in FIG. 3, when the second ends 311b contact each other, the joint units 311 may contact each other, and the support member 300-1 may have the bent form. Thus, the support member 300-1 in the unfolded form may be attached to the substrate 100-1 including non-display curved portion 130 having a generally flat shape, and the second ends 311b may contact each other so that the non-display curved portion 130 is bent. The joint units 311 may contact each other, so that the support member 300-1 varies from the unfolded form to the bent form, and the second generally curved surface 132 of the non-display curved portion 130 is formed. In other words, after the non-display curved portion 130 having a generally flat shape is attached to the support member 300-1 having the generally flat shape, the second generally curved surface 132 of the non-display curved portion 130 may be formed by being bent by the support member 300-1. Thus, cracks may not be generated on the substrate 100-1 since no pressure is applied to the first generally curved surface 124 of the display curved portion 120, and the non-display curved portion 130 may be uniformly adhered to the support member 300-1, so that the non-display curved portion 130 is not detached from the support member 300-1.

Figure 5:
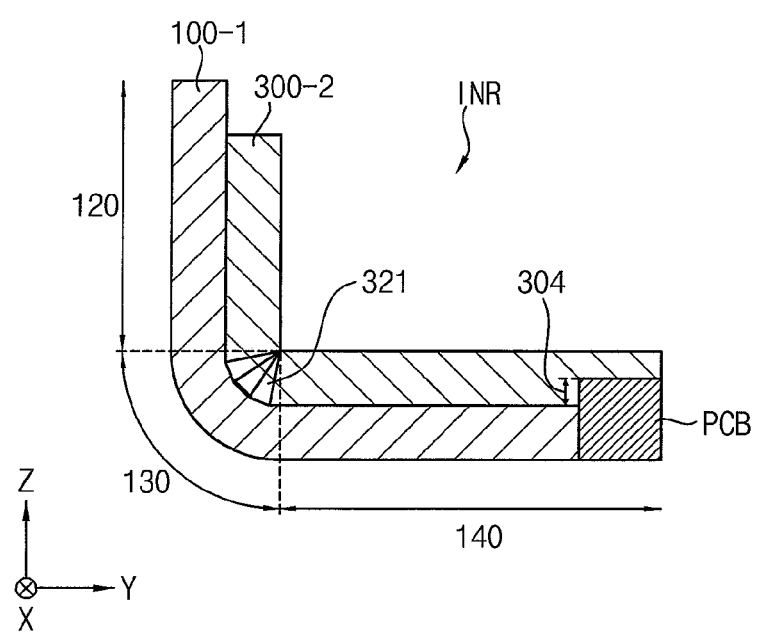
FIG. 5 and FIG. 6 are cross-sectional views of another exemplary embodiment of is a bent and an unbent substrate support of FIG. 1, respectively, constructed according to principles of the invention.
Figure 6:
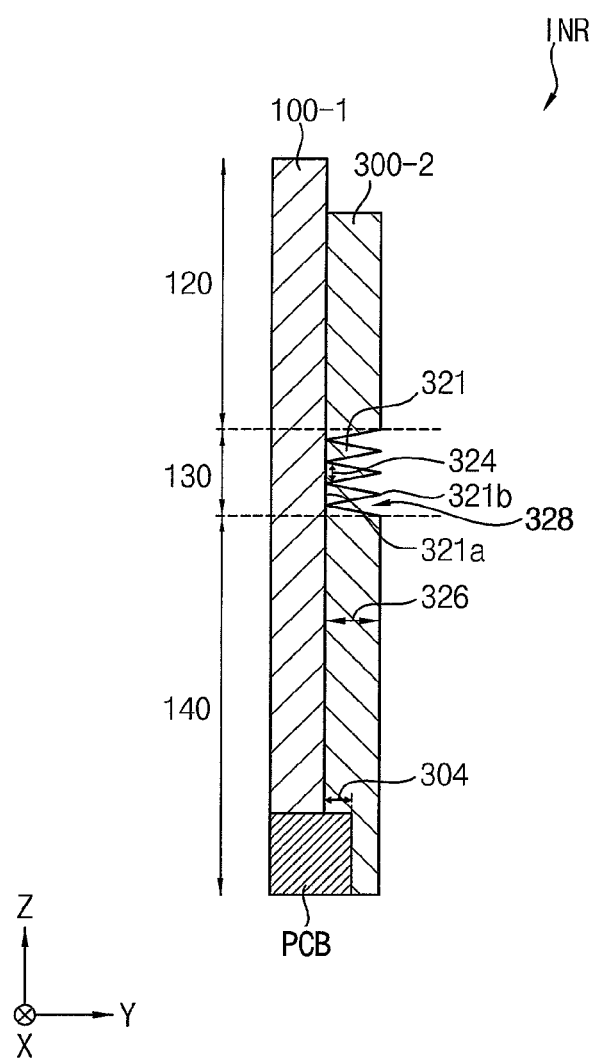

FIG. 5 and FIG. 6 are cross-sectional views of another exemplary embodiment of a bent and an unbent substrate support of FIG. 1, respectively, constructed according to principles of the invention.

Referring to FIG. 5 and FIG. 6, a support member 300-2 may be attached to the inner side INR of the substrate 100-1, and may support the substrate 100-1. In addition, the support member 300-2 may include a plurality of joint units 321 attached to the non-display curved portion 130. However, since the support member 300-2 is the same as the support member 300-1 except for a cross-sectional shape of each of the joint units 321, the support member 300-2 will be described in abbreviated form based on the cross-sectional shape of each of the joint units 321 to avoid redundancy.

The width 324 of each of the joint units 321 may decrease as the distance 326 from the substrate 100-1 increases in a cross-sectional view. For example, the width 324 of each of the joint units 321 may decrease toward the inner side INR of the substrate 100-1. In detail, each of the joint units 321 may include a first end 321a directly attached to the non-display curved portion 130 and a second end 321b opposed to the first end 321a. The first ends 321a may connect to each other, and the second ends 321b may be separated from each other. As a result, a sum of lengths of the first ends 321a may be longer than a sum of lengths of the second ends 321b. Thus, gaps 328 may be formed between the joint units 321.

As shown in FIG. 5 and FIG. 6, the cross-sectional shape of each of the joint units 321 may be generally triangular. However, this is merely an example, and the cross-sectional shape of each of the joint units 321 is not limited thereto. In the illustrated exemplary embodiment, cross-sectional shapes of the joint units 321 are identical to each other. In other exemplary embodiments, at least two or more of the cross-sectional shapes of the joint units 321 may be different. In some exemplary embodiments, the cross-sectional shapes of the joint units 321 may be individually determined according to corresponding positions in the second generally curved surface 132.

Figure 7:
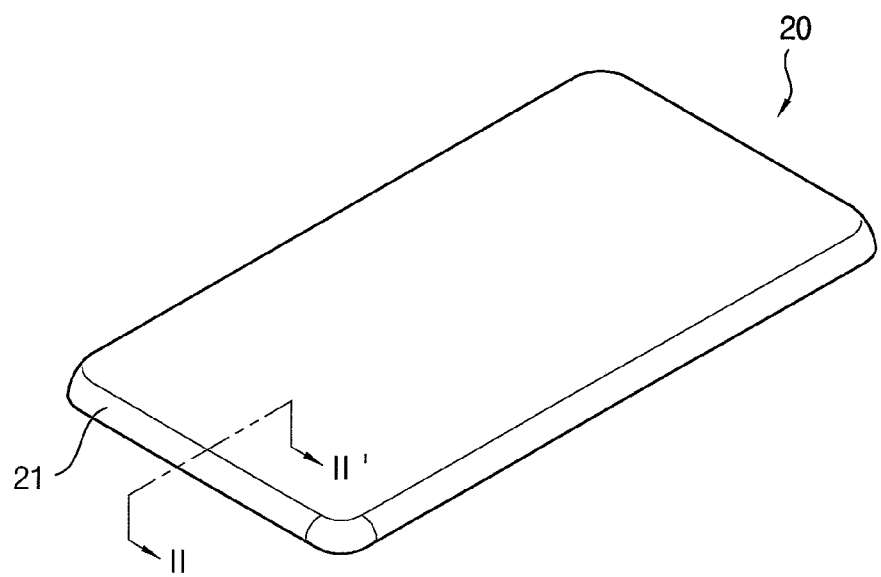
FIG. 7 is a perspective view of another exemplary embodiment illustrating a display device constructed according to principles of the invention.
Figure 8:
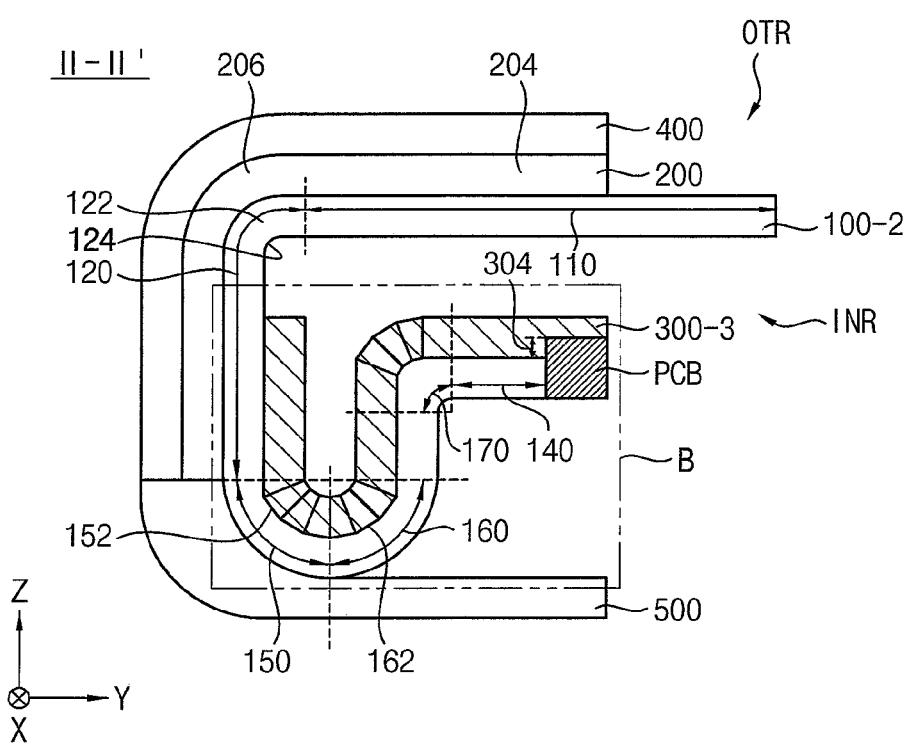
FIG. 8 is a cross-sectional view taken along line II-II' of FIG. 7.

FIG. 7 is a perspective view of another exemplary embodiment illustrating a display device constructed according to principles of the invention. FIG. 8 is a cross-sectional view taken along line II-IF of FIG. 7.

Referring to FIG. 7 and FIG. 8, a display device 20 may include a substrate 100-2, a display layer 200, a support member 300-3 and a window 400. However, since the display device 20 is the same as the display device 10 except for the substrate 100-2 and the support member 300-3, the display device 20 will be described in abbreviated form based on the substrate 100-2 and the support member 300-3 to avoid redundancy.

The substrate 100-2 may include a display front portion 110 to which a portion 204 of the display layer 200 attached to the outer side OTR of the substrate 100-2, a display curved portion 120 to which another portion 206 of the display layer 200 attached to the outer side OTR of the substrate 100-2, first to third non-display curved portions 150, 160, and 170 to which the display layer 200 is not attached, and a non-display rear portion 140 to which the display layer 200 is not attached. For example, at least a portion 122 of the display curved portion 120 may form a first generally curved surface 124, and substantially the entirety of the first to third non-display curved portions 150, 160, and 170 may form respective curved surfaces 152, 162, and 172. However, since the display front portion 110, the display curved portion 120, and the non-display rear portion 140 are the same as described above, only the first to third non-display curved portions 150, 160, and 170 will be described below to avoid redundancy.

The substrate 100-2 may include the first to third non-display curved portions 150, 160, and 170. For example, as shown in FIG. 8, the substrate 100-2 may include the first to third non-display curved portions 150, 160, and 170. The substrate 100-2 shown in FIG. 8 further includes the second and third non-display curved portions 160 and 170 in addition to the non-display curved portion 130 of the substrate 100-1 shown in FIG. 2, so that the non-display rear portion 140 of the display device 20 is closer to the display front portion 110, and the display device 20 is implemented with a thin thickness and has a stable structure.

The support member 300-3 may be attached to the inner side INR of the substrate 100-2, and may support the substrate 100-2. In addition, the support member 300-3, upon application of an external force, may bend the non-display curved portions 150, 160, and 170 of the substrate 100-2. The support member 300-3 may include a step difference 304 corresponding to the shape of the printed circuit board PCB disposed (or connected) adjacent to the non-display rear portion 140. The structure of the support member 300-3 will be described in detail with reference to FIG. 9 and FIG. 10.

The support member 300-3 may be attached to the inner side INR of the substrate 100-2. For example, the display device 20 may further include an adhesive layer disposed between the support member 300-3 and the substrate 100-2, so that the support member 300-3 is attached to the inner side INR of the substrate 100-2. The adhesive layer may be formed in a film form such that the adhesive layer is attached to the support member 300-3, or may be formed in a particle form such that the adhesive layer is applied on the support member 300-3. The adhesive layer may include an optically clear adhesive or a pressure sensitive adhesive.

The display device 20 may further include a cover 500 and/or a functional layer. However, since the details of the cover 500 and the functional layer are as described above, a description thereof will be omitted to avoid redundancy.

Figure 9:
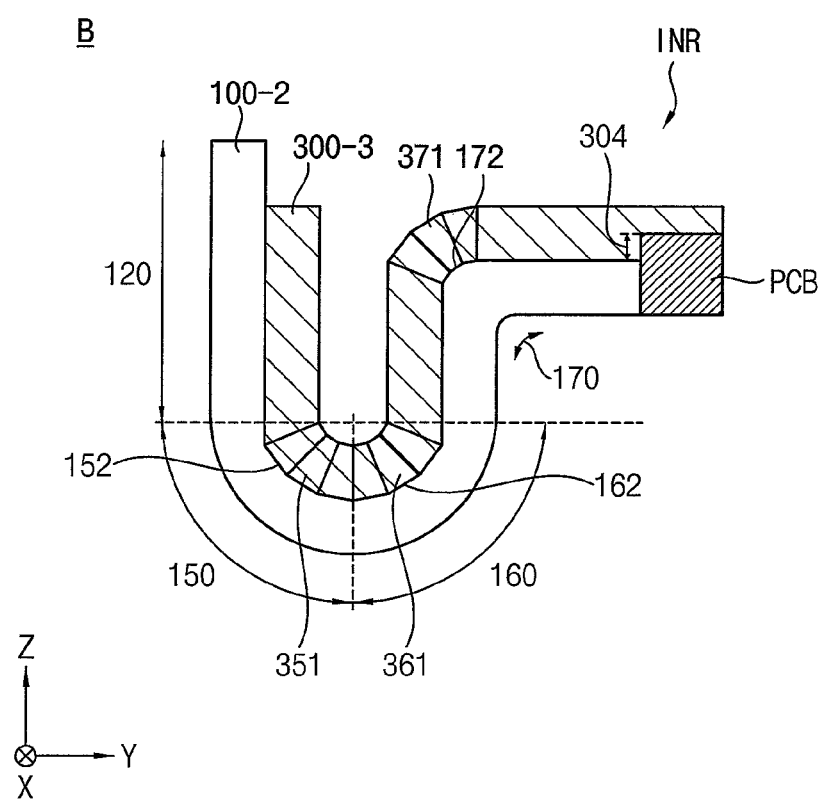
FIG. 9 is a cross-sectional enlarged view of Area B of FIG. 8.
Figure 10:
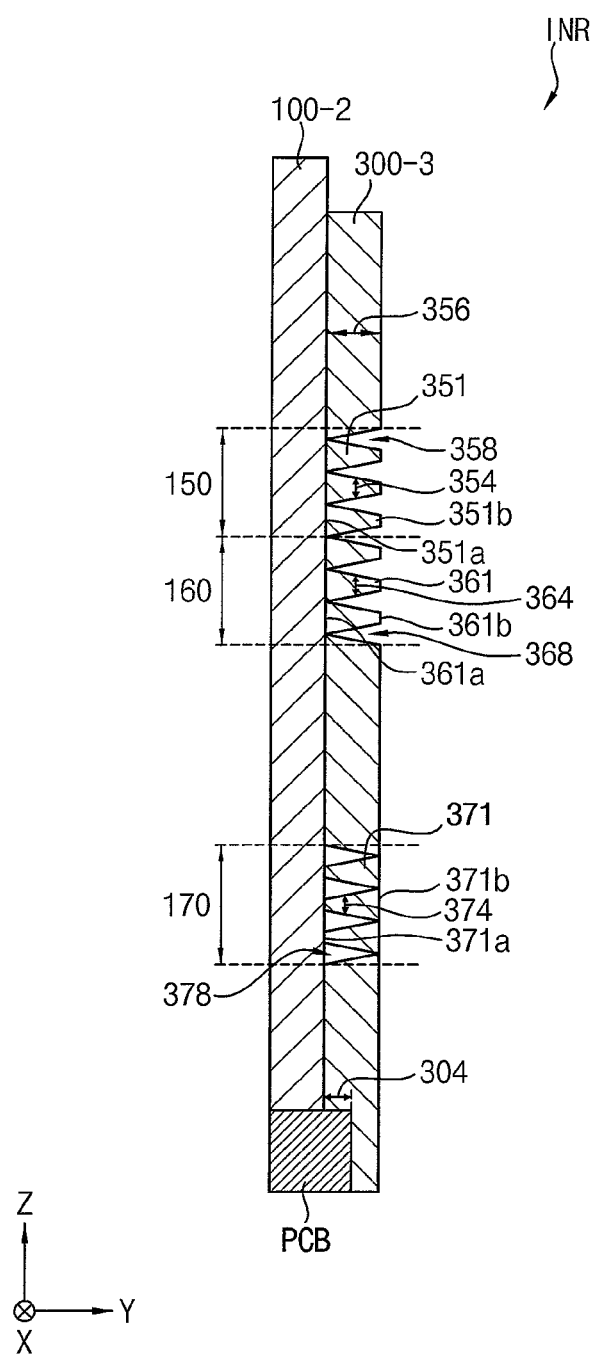
FIG. 10 is a cross-sectional view of another exemplary embodiment of the unbent substrate and support of FIG. 7.

FIG. 9 is a cross-sectional enlarged view of Area B of FIG. 8. FIG. 10 is a cross-sectional view of another exemplary embodiment of the unbent substrate and support of FIG. 7.

Referring to FIG. 9 and FIG. 10, the support member 300-3 may be attached to the inner side INR of the substrate 100-2, and may support the substrate 100-2. In addition, the support member 300-3 may include first to third joint units 351, 361, and 371 attached the non-display curved portions 150, 160, and 170, respectively.

The width 354 of each of the first joint units 351 may decrease as the distance 356 from the substrate 100-2 increases in a cross-sectional view. For example, the width 354 of each of the first joint units 351 may decrease toward the inner side INR of the substrate 100-2. In detail, each of the first joint units 351 may include a first end 351a directly attached to the substrate 100-2, and a second end 351b opposed to the first end 351a. The first end 351a may connect to each other, and the second ends 351b may be separated from each other. As a result, a sum of lengths of the first ends 351a may be longer than a sum of lengths of the second ends 351b. Gaps 358 may be formed between the joint units 351.

The width 364 of each of the second joint units 361 may decrease as the distance 356 from the substrate 100-2 increases in a cross-sectional view. For example, the width 364 of each of the second joint units 361 may decrease toward the inner side INR of the substrate 100-2. In detail, each of the second joint units 361 may include a first end 361a directly attached to the substrate 100-2, and a second end 361b opposed to the first end 361a. The first end 361a may connect to each other, and the second ends 361b may be separated from each other. As a result, a sum of lengths of the first ends 361a may be longer than a sum of lengths of the second ends 361b. Gaps 368 may be formed between the joint units 361.

The width 374 of each of the third joint units 371 may increase as the distance 356 from the substrate 100-2 increases in a cross-sectional view. For example, the width 374 of each of the third joint units 371 may increase toward the inner side INR of the substrate 100-2. In detail, each of the third joint units 371 may include a first end 371a directly attached to the substrate 100-2, and a second end 371b opposed to the first end 371a. The first end 371a may be separated from each other, and the second ends 371b may connect to each other. As a result, a sum of lengths of the first ends 371a may be shorter than a sum of lengths of the second ends 371b. Gaps 378 may be formed between representative joint units 371.

In some exemplary embodiments, a cross-sectional shape of each of the first to third joint units 351, 361, and 371 may be generally trapezoidal. In other exemplary embodiments, the cross-sectional shape of each of the first to third joint units 351, 361, and 371 may be generally triangular. However, this is merely an example, and the cross-sectional shape of each of the first to third joint units 351, 361, and 371 is not limited thereto. Each of the first to third joint units 351, 361, and 371 may contact each other in various ways.

As an external pressure is applied to the first to third joint units 351, 361, and 371, each of the first to third joint units 351, 361, and 371 may contact each other, and the support member 300-3 may vary from an unfolded form to a bent form. In detail, as shown in FIG. 10, when each of the second ends 351b of the first joint units 351, each of the second ends 361b of the second joint units 361, and each of the third ends 371b of the third joint units 371 are separated from each other, the support member 300-3 may have the unfolded form. As shown in FIG. 9, when each of the second ends 351b of the first joint units 351, each of the second ends 361b of the second joint units 361, and each of the third ends 371b of the third joint units 371 contact each other, the support member 300-3 may have the bent form. Thus, the support member 300-3 in the unfolded form may be attached to the substrate 100-2 including the first to third non-display curved portions 150, 160, and 170 having a generally flat shape, and the first to third non-display curved portions 150, 160, and 170 may be bent by bending the support member 300-3.

Figure 11:
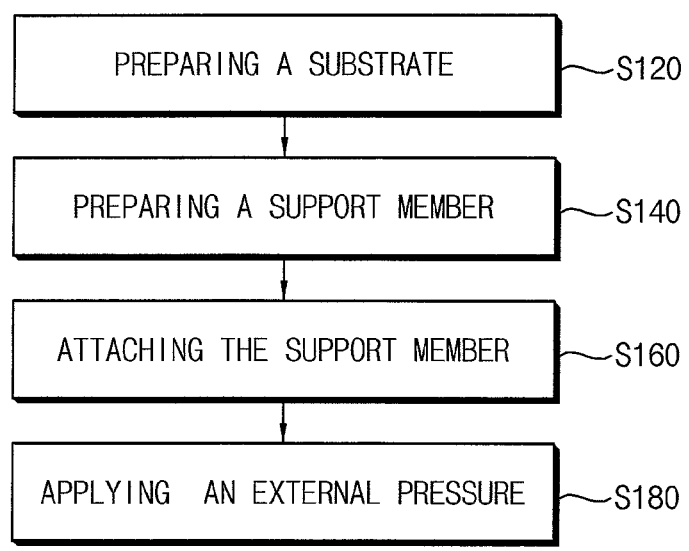
FIG. 11 is a flowchart illustrating an exemplary method of manufacturing the display device according to principles of the invention.

FIG. 11 is a flowchart illustrating an exemplary method of manufacturing the display device according to principles of the invention. FIGS. 12-15 are cross-sectional views illustrating certain steps in the exemplary method of manufacturing the display device of FIG. 11.

Referring to FIGS. 11-15, the display device 10 may be manufactured by preparing a substrate 100-1 (S120), preparing a support member 300-1 (S140), attaching the support member 300-1 to the inner side INR of the substrate 100-1 (S160), and applying an external pressure to the support member 300-1 (S180).

Figure 12:
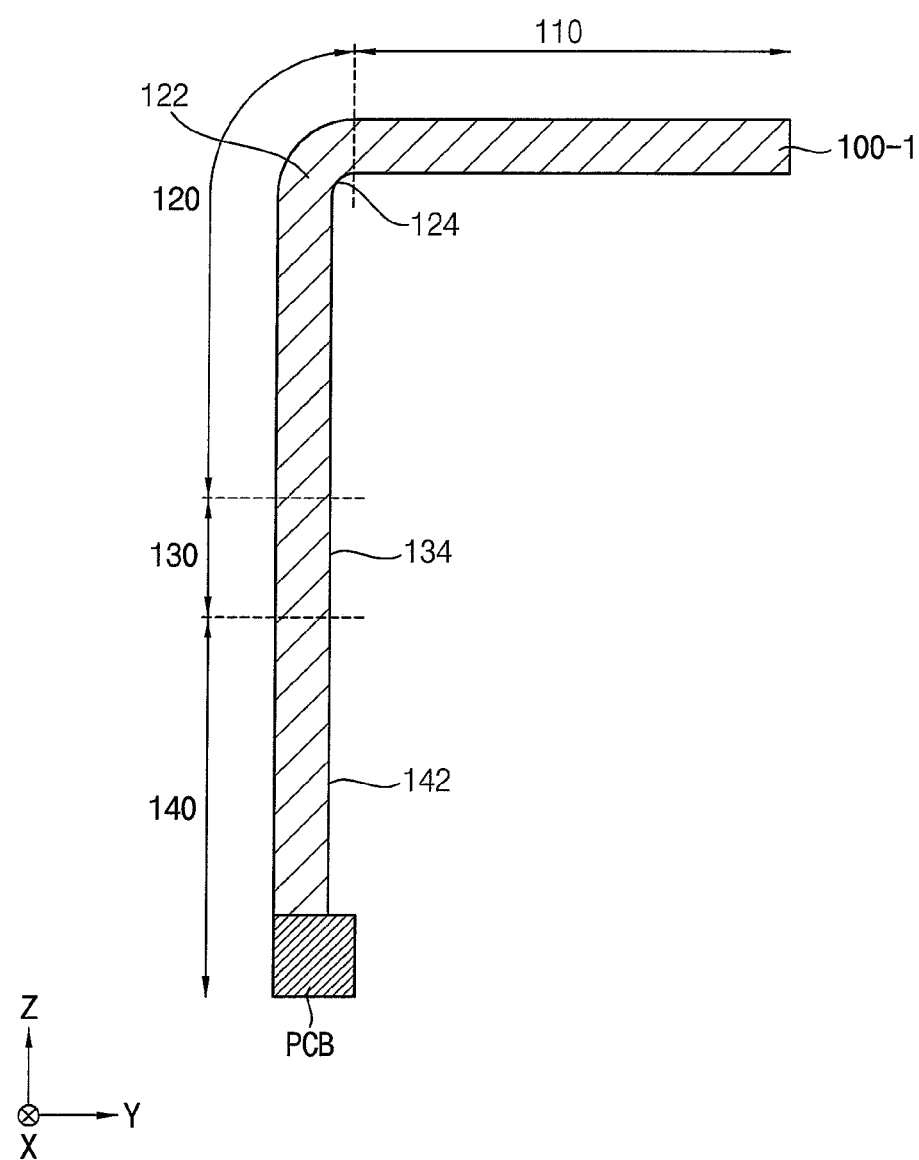
FIGS. 12-15 are cross-sectional views illustrating certain steps in the exemplary method of manufacturing the display device of FIG. 11.

As shown in FIG. 12, the substrate 100-1 may be prepared (S120). For example, the substrate 100-1 including a display front portion 110, a display curved portion 120 including at least a portion 122 forming a first generally curved surface 124, a non-display curved portion 130 to be bent by the external pressure, and a non-display rear portion 140 having a generally flat surface 142 may be prepared. In the illustrated exemplary embodiment, the non-display curved portion 130 before bending may have a generally flat surface 134. In addition, a printed circuit board PCB may be disposed adjacent to the non-display rear portion 140.

Figure 13:
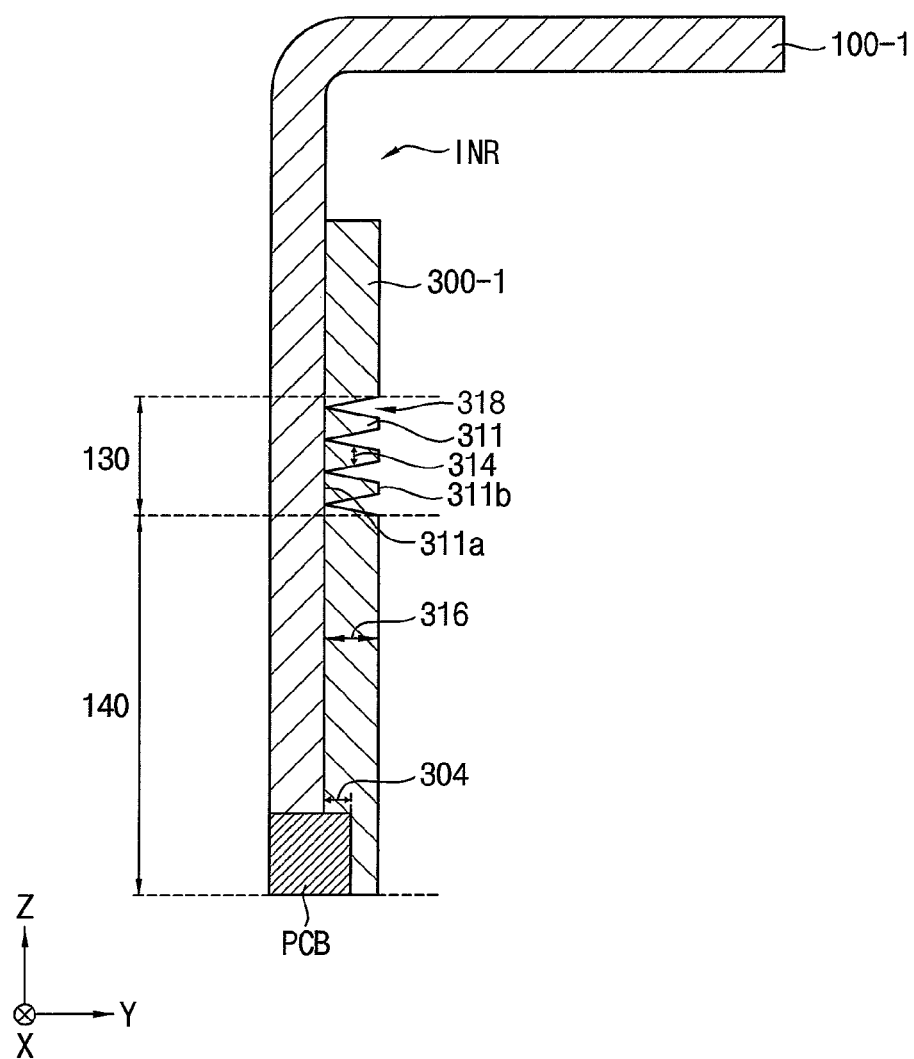

As shown in FIG. 13, the support member 300-1 may be prepared (S140). For example, the support member 300-1 may include joint units 311 attached to the non-display curved portion 130. In some exemplary embodiments, the joint units 311 may be formed corresponding to the non-display curved portion 130. In addition, the width 314 of each of the joint units 311 may decrease as the distance 316 from the substrate 100-1 increases in a cross-sectional view. In detail, each of the joint units 311 may include a first end 311a directly attached to the non-display curved portion 130 and a second end 311b opposed to the first end 311a. The first end 311a may connect to each other, and the second ends 311b may be separated from each other. As a result, the sum of lengths of the first ends 311a may be longer than the sum of lengths of the second ends 311b. Gaps 318 are disposed between the joint units 311.

The cross-sectional shape of each of the joint units 311 is generally trapezoidal in FIG. 13, but the cross-sectional shape of each of the joint units 311 is not limited thereto. In addition, the support member 300-1 may include a recess in the form of a step difference 304 corresponding to the shape of the printed circuit board PCB disposed adjacent to the non-display rear portion 140.

Figure 14:
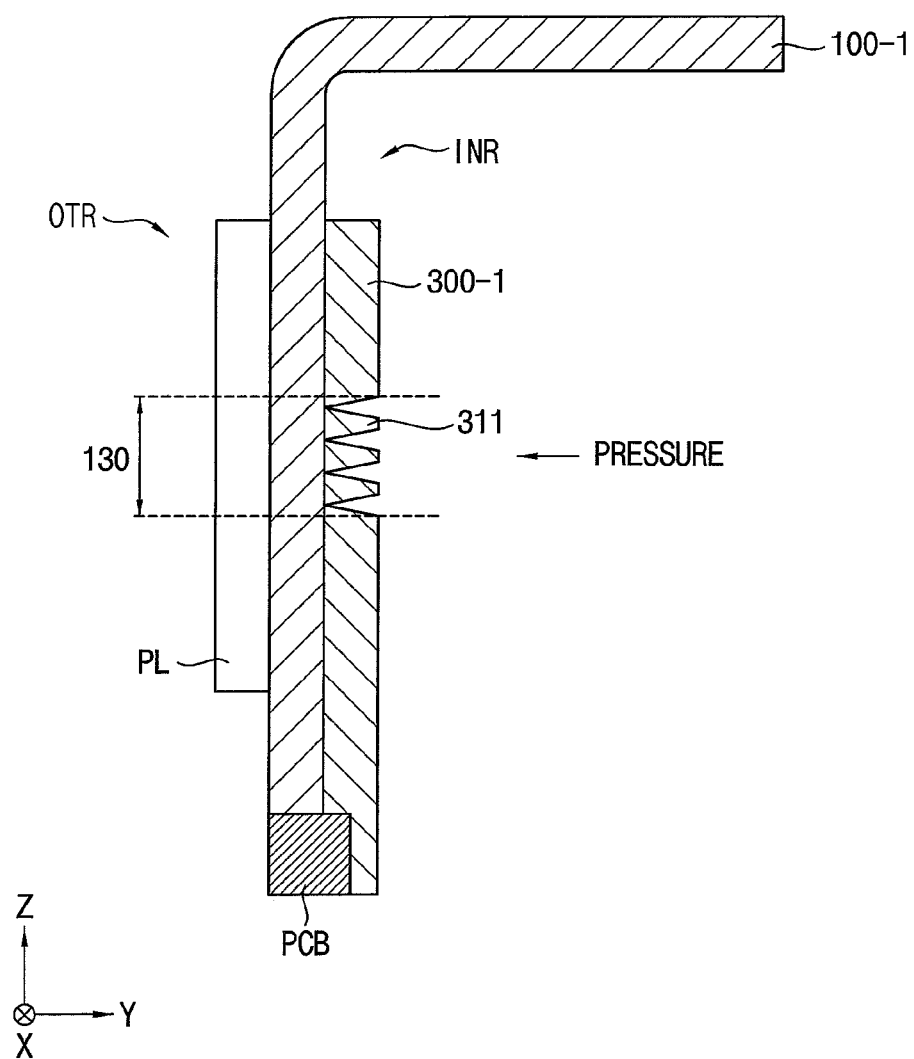

As shown in FIG. 14, the support member 300-1 may be attached to the inner side INR of the substrate 100-1. For example, the support member 300-1 may be attached to the inner side INR of the substrate 100-1, so that the joint units 311 are attached to the non-display curved portion 130 having a generally flat shape. In some exemplary embodiments, the support member 300-1 may be attached to the substrate 100-1 through any suitable technique such as a mechanical technique or a chemical technique. For example, an adhesive layer including an optically clear adhesive and/or a pressure sensitive adhesive may be formed between the support member 300-1 and the substrate 100-1, and the support member 300-1 may be attached to the substrate 100-1 by applying a pressure to the support member 300-1. In some exemplary embodiments, an attaching plate PL may be disposed on the outer side OTR of the substrate 100-1 to attach the support member 300-1 to the inner side INR of the substrate 100-1 more firmly. In detail, after the attaching plate PL is disposed on the outer side OTR of the substrate 100-1, the support member 300-1 may be attached to the inner side INR of the substrate 100-1 by applying pressure to the support member 300-1. Thereafter, the attaching plate PL may be removed. In the method of FIG. 11, cracks may not be generated on the substrate 100-1 since no pressure is applied to the first generally curved surface of the display curved portion 120, as depicted in FIG. 2, and the non-display curved portion 130 may be uniformly adhered to the support member 300-1, so that the non-display curved portion 130 is not readily detached from the support member 300-1.

Figure 15:
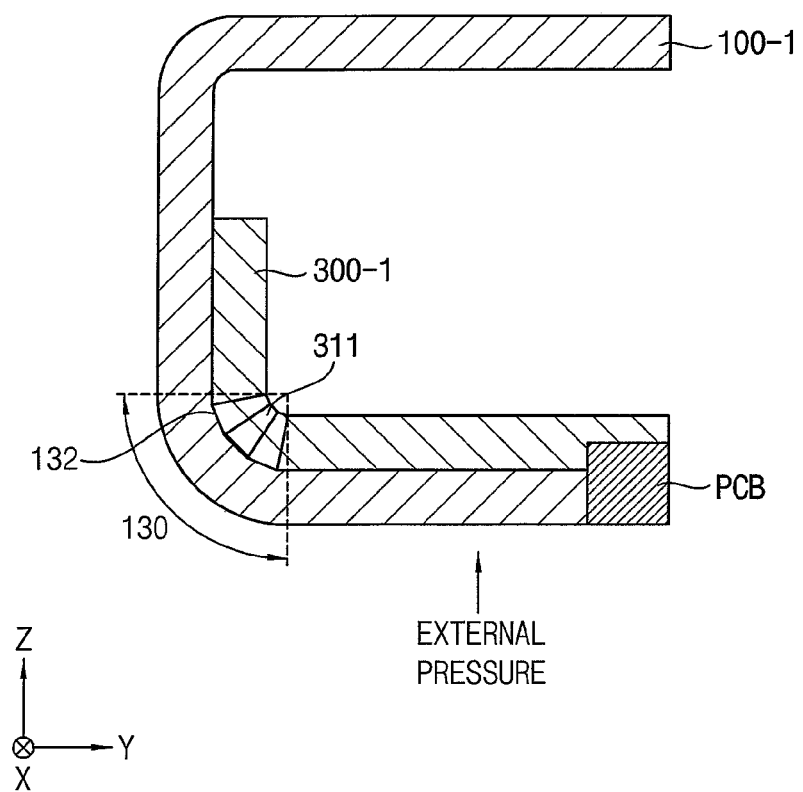

As shown in FIG. 15, the external pressure may be applied to bend the support member 300-1 (S160). For example, the external pressure may be applied to the support member 300-1 such that substantially the entire portion of the non-display curved portion 130 forms a second generally curved surface 132 by the joint units 311 contacting each other. In some exemplary embodiments, the support member 300-1 may further include an adhesive disposed between the joint units 311, and the joint units 311 may be adhered to each other by the adhesive when substantially the entire portion of the non-display curved portion 130 forms the second generally curved surface 132 by the external pressure.

In addition, the display device 10 may include the display layer 200 by attaching the display layer 200 to the outer side OTR of the display front portion 110 and the display curved portion 120, and may include the window 400 by attaching the window 400 to the outer side OTR of the display layer 200, as depicted in FIG. 2.

FIGS. 16, 17, and 18A-C are cross-sectional views illustrating another exemplary method of manufacturing the display device of FIG. 11.

Referring to FIGS. 11, 16-17, and 18A-C, the display device 20 may be manufactured by preparing a substrate 100-2 (S120), preparing a support member 300-3 (S140), attaching the support member 300-3 to an inner side INR of the substrate 100-2 (S160), and applying an external pressure to the support member 300-3 (S180).

Figure 16:
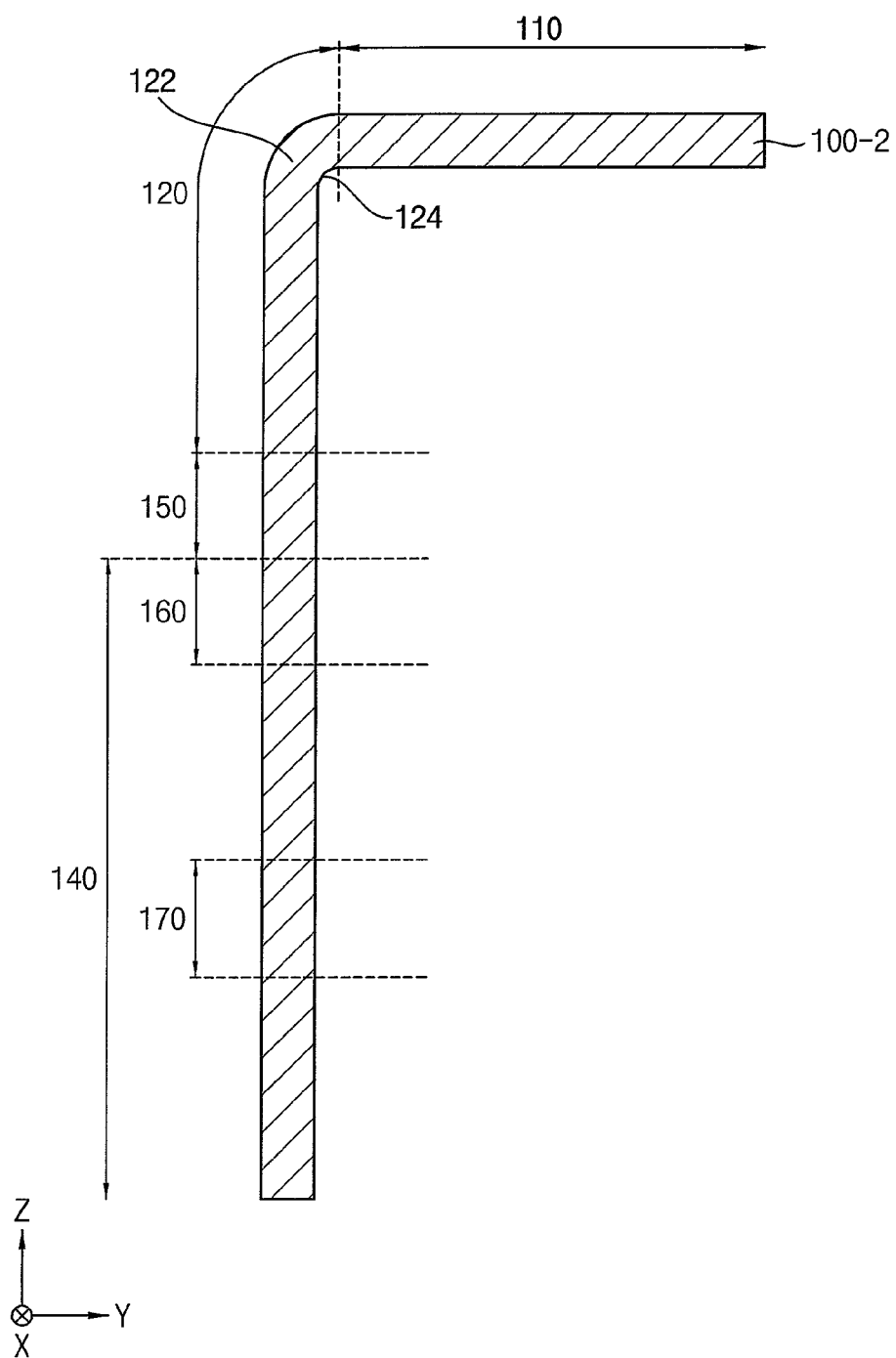
FIGS. 16, 17, and 18A-C are cross-sectional views illustrating another exemplary method of manufacturing the display device of FIG. 11.

As shown in FIG. 16, the substrate 100-2 may be prepared (S120). For example, the substrate 100-2 may include a display front portion 110, a display curved portion 120 including at least a portion 122 forming a first generally curved surface 124, first to third non-display curved portions 150, 160, and 170 bendable by external pressure, and a non-display rear portion 140.

Figure 17:
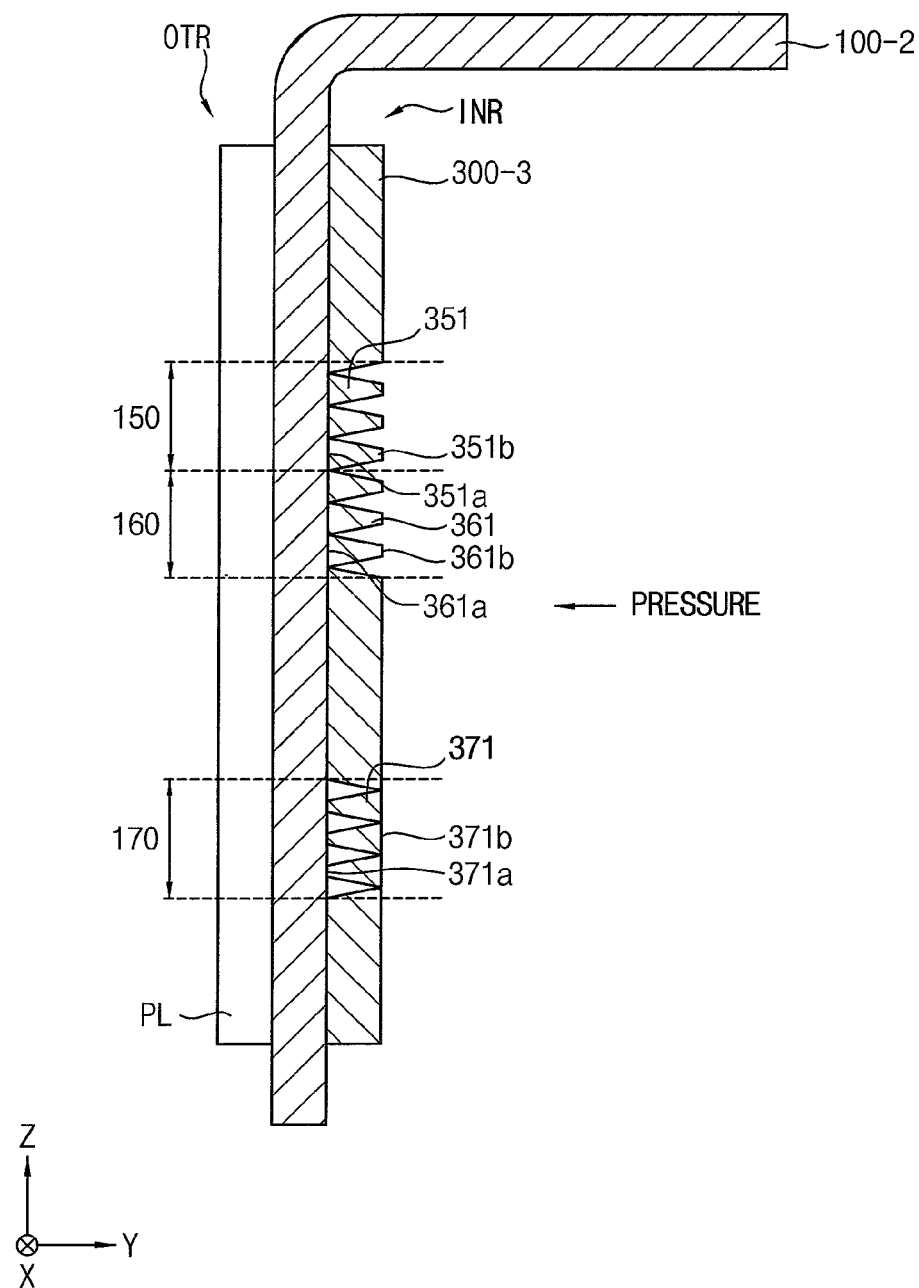

As shown in FIG. 17, the support member 300-3 may be prepared (S140). For example, the support member 300-3 may include first to third joint units 351, 361, and 371 respectively attached the first to third non-display curved portions 150, 160, and 170. Since a description of the first to third joint units 351, 361, and 371 is as described above, a repetitive description thereof will be omitted to avoid redundancy. In addition, the support member 300-3 may be attached to the inner side INR of the substrate 100-2. For example, the support member 300-3 may be attached to the inner side INR of the substrate 100-2, so that the first to third joint units 351, 361, and 371 are respectively attached to the first to third non-display curved portions 150, 160, and 170 having a generally flat shape.

Figure 18A:
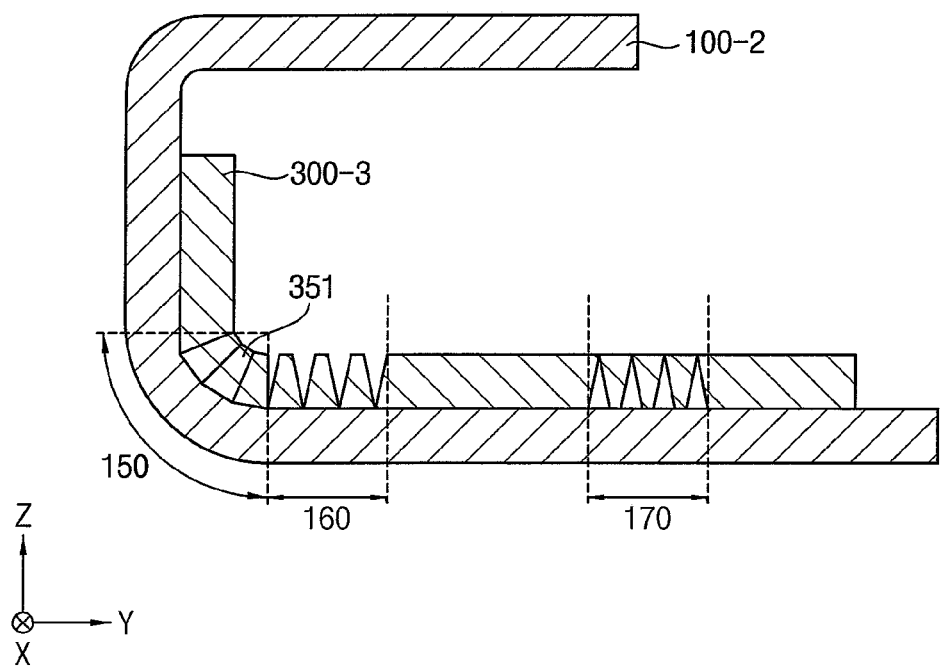
Figure 18B:
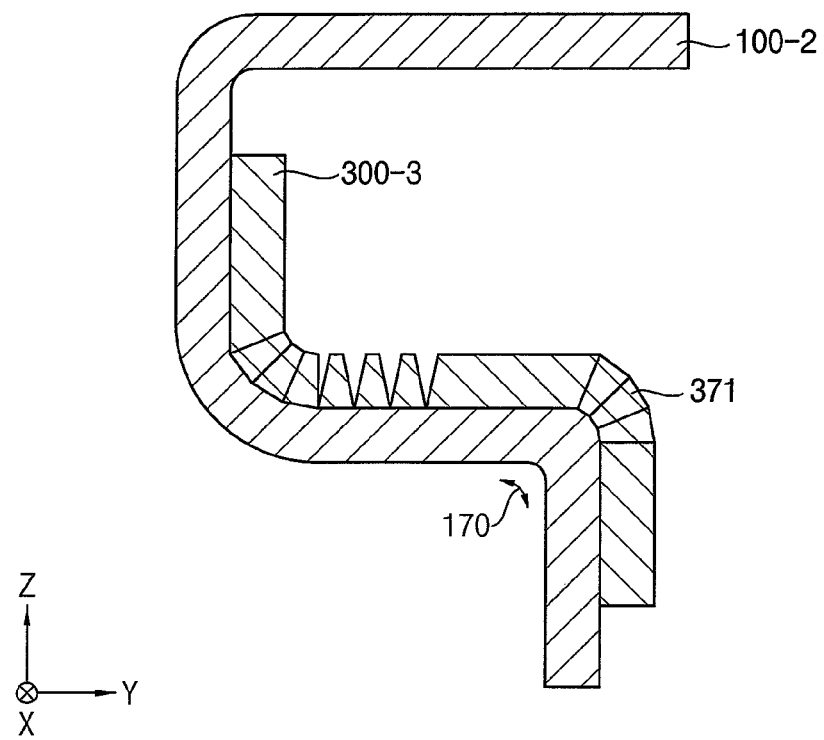
Figure 18C:
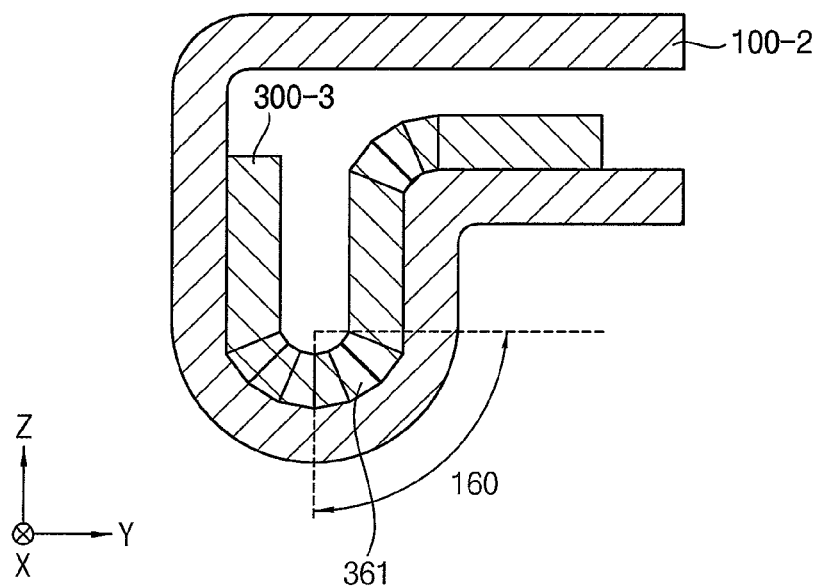

As shown in FIGS. 18A-C, the external pressure may be applied to the support member 300-3 (S160). For example, as shown in FIG. 18A, the external pressure may be applied to the support member 300-3 such that substantially an entire portion of the first non-display curved portion 150 forms a curved surface by the joint units 351 contacting each other. Next, as shown in FIG. 18B, the external pressure may be applied to the support member 300-3 such that substantially an entire portion of the third non-display curved portion 170 forms a curved surface by contacting the joint units 371 to each other. Next, as shown in FIG. 18C, the external pressure may be applied to the support member 300-3 such that substantially an entire portion of the second non-display curved portion 160 forms a curved surface by contacting the joint units 361 to each other.

In the bending of the support member 300-3, since the first and second non-display curved portions 150 and 160 are both bent, the non-display rear portion 140, as depicted in FIG. 8, may collide with the display front portion 110. To prevent the collision, the first joint units 351, the second joint units 361, and the third joint units 371 may contact each other in a predetermined order. For example, first the third joint units 371 may contact each other, and then the second joint units 361 may contact each other, and then the first joint units 351 may contact each other. However, the method for preventing the collision is not limited thereto.

The principles of the invention may be applied to a display device and an electronic device using the display device. For example, some exemplary embodiments include a cellular phone, a smart phone, a video phone, a smart pad, a smart watch, a tablet PC, a car navigation system, a television, a computer monitor, a laptop, etc.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
   a substrate including a display front portion, a display curved portion, a non-display curved portion, and a non-display rear portion;
   a display layer attached to the display front portion and the display curved portion;
   a member attached to an inner side of the substrate, and including articulations attached to an inner side of the non-display curved portion; and
   a window attached to an outer side of the display layer;
   wherein the display layer is attached to an outer side of the substrate,
     at least a portion of the display curved portion forms a first generally curved surface,
     at least a portion of the non-display curved portion forms a second generally curved surface,
     the non-display rear portion forms a substantially flat surface,
     at least one of the articulations has a cross-sectional width that decreases in a direction away from the substrate, and
     at least one of the articulations contacts each other to form the second generally curved surface of the non-display curved portion,
   wherein each of the articulations has a first end that is in direct contact with the inner side of the non-display curved portion, and
   wherein the articulations do not overlap the display layer.

2. The display device of claim 1, wherein at least one of the articulations has a generally trapezoidal cross-sectional shape.

3. The display device of claim 1, wherein at least one of the articulations has a generally triangular cross-sectional shape.

4. The display device of claim 1, wherein the articulations comprise joint units having substantially identical cross-sectional shapes.

5. The display device of claim 1, wherein at least one of the cross-sectional shapes of the articulations individually matched to positions in the second generally curved surface.

6. The display device of claim 1, wherein the member comprises a support member including an adhesive disposed between the articulations.

7. The display device of claim 6, wherein at least one of the articulations adheres to each other by the adhesive when the second generally curved surface of the non-display curved portion is formed by the external pressure.

8. The display device of claim 1, further comprising:
   a printed circuit board disposed adjacent to the non-display rear portion of the substrate; wherein the member has a recess corresponding to a shape of the printed circuit board.

9. A method of manufacturing a display device, the method comprising the steps of:
   preparing a substrate including a display front portion, a display curved portion including at least a portion forming a first generally curved surface, a non-display curved portion configured to be bent by an external pressure, and a non-display rear portion having a generally flat surface;
   preparing a member including articulations;
   attaching the member to an inner side of the substrate such that the articulations are attached to an inner side of the non-display curved portion and at least one of the articulations has a cross-sectional width that decreases in a direction away from the substrate to form at least one gap therebetween; and
   applying the external pressure to the member to close the at least one gap such that at least one of the articulations contacts each other and at least a portion of the non-display curved portion forms a second generally curved surface,
   wherein each of the articulations has a first end that is in direct contact with the inner side of the non-display curved portion, and
   wherein the articulations do not overlap the display front portion and the display curved portion.

10. The method of claim 9, wherein at least one of the articulations has a generally trapezoidal cross-sectional shape.

11. The method of claim 9, wherein at least one of the articulations has a generally triangular cross-sectional shape.

12. The method of claim 9, wherein the articulations comprise joint units having substantially identical cross-sectional shapes.

13. The method of claim 9, wherein at least one of the cross-sectional shapes of the articulations is individually positioned to match to the second generally curved surface.

14. The method of claim 9, wherein the member comprises a support member having an adhesive disposed between the articulations.

15. The method of claim 14, wherein at least one of the articulations adheres to each other by the adhesive when the second generally curved surface of the non-display curved portion is formed by external pressure.

16. The method of claim 9, wherein the member comprises a support member and further comprising:
   forming a recess in the support member corresponding to a shape of a printed circuit board; and
   disposing a printed circuit board in the recess adjacent to the non-display rear portion of the substrate.

17. The method of claim 9, further comprising attaching a display layer to an outer surface of the display front portion and an outer side of the display curved portion.

18. The method of claim 17, further comprising attaching a window to an outer side of the display layer.

19. The method of claim 9, wherein a plate is disposed on an outer side of the substrate when the member is attached to the inner side of the substrate.

* * * * *